United States Patent
Park

(10) Patent No.: US 7,876,624 B2
(45) Date of Patent: Jan. 25, 2011

(54) DATA INPUT CIRCUIT AND SEMICONDUCTOR MEMORY DEVICE INCLUDING THE SAME

(75) Inventor: Ki-Chon Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 126 days.

(21) Appl. No.: 12/327,024

(22) Filed: Dec. 3, 2008

(65) Prior Publication Data

US 2010/0054046 A1 Mar. 4, 2010

(30) Foreign Application Priority Data

Aug. 29, 2008 (KR) ..................... 10-2008-0085487

(51) Int. Cl.
*G11C 7/00* (2006.01)
(52) U.S. Cl. .............................. 365/189.05; 365/230.03
(58) Field of Classification Search ............ 365/189.05, 365/230.03
See application file for complete search history.

(56) References Cited

U.S. PATENT DOCUMENTS 5,629,983 A * 5/1997 Fujimoto ..................... 380/46

FOREIGN PATENT DOCUMENTS

KR 1020010004210 A 1/2001
KR 1020060105924 A 10/2006

OTHER PUBLICATIONS

Notice of Allowance issued from Korean Intellectual Property Office on Mar. 29, 2010.
Notice of Preliminary Rejection issued from Korean Intellectual Property Office on Sep. 30, 2009 with an English Translation.

* cited by examiner

*Primary Examiner*—Michael T Tran
(74) *Attorney, Agent, or Firm*—IP & T Group LLP

(57) ABSTRACT

A semiconductor memory device capable of reducing a whole area thereof includes a plurality of data input circuits configured to reflect inversion information on data inputted thereto, a plurality of global lines for transferring data outputted from the plurality of data input circuits, and a plurality of memory banks for storing data transferred from the plurality of global lines.

10 Claims, 9 Drawing Sheets

FIG. 1
(RELATED ART)

| BANK0 10 | X | X | BANK2 30 | BANK0 50 | X | X | BANK2 70 |
|---|---|---|---|---|---|---|---|
| Y | | | Y | Y | | | Y |
| Y | | | Y | Y | | | Y |
| BANK1 20 | X | X | BANK3 40 | BANK1 60 | X | X | BANK3 80 |
| DPERI | | | CPERI | | | DPERI | |
| BANK0 90 | X | X | BANK2 110 | BANK0 130 | X | X | BANK2 150 |
| Y | | | Y | Y | | | Y |
| Y | | | Y | Y | | | Y |
| BANK1 100 | X | X | BANK3 120 | BANK1 140 | X | X | BANK3 160 |

DATA INPUT CIRCUIT AND SEMICONDUCTOR MEMORY DEVICE INCLUDING THE SAME

CROSS-REFERENCE TO RELATED APPLICATIONS

This application claims priority to Korean patent application number 10-2008-0085487, filed on Aug. 29, 2008, which is incorporated by reference in its entirety.

BACKGROUND OF THE INVENTION

The present subject matter relates to a semiconductor memory device, and more particularly, to a technology for reducing a total area of a memory device by changing a scheme of performing a data inversion operation.

A write data bus inversion (WDBI) function is used to reduce simultaneous switching output (SSO) noise by minimizing the change of data when the data is inputted to a memory device from a memory controller. The memory controller may be referred to as a chipset.

The memory controller sends such inversion information as WDBI together with the data to the memory device to thereby allow the memory device to judge whether the data is inverted or not.

FIG. 1 illustrates a configuration of a semiconductor memory device having a conventional 4 quarter bank structure.

Referring to FIG. 1, each of 4 banks BANK0 to BANK3 is divided into 4 sub-banks and the 4 sub-banks are disposed in 4 different quarters. For instance, the bank BANK0 is divided to 4 sub-banks having reference numerals 10, 50, 90 and 130. X around each of the banks represents a circuit for performing a row operation and Y around each of the banks represents a circuit for executing a column operation.

Moreover, CPERI shows a region in which circuits relating to a clock are disposed and DPERI shows a region in which circuits relating to data input/output are disposed.

FIG. 2 illustrates paths through which data are transmitted from data input circuits to banks.

Data are inputted in series through data pins of a memory device. Data pins DQ0 to DQ7 of the memory device include respective data input circuits 210 to 280. The data input circuits 210 to 280 align serially inputted data in parallel and transfer the aligned data to global lines GIO0<0:7> to GIO7<0:7>. In case that the memory device employs an 8-bit prefetch scheme, each of the data input circuits 210 to 280 aligns 8 data serially inputted through a corresponding one of the data pins DQ0 to DQ7 in parallel and the data input circuits 210 to 280 transmit the aligned data to the respective global lines GIO0<0:7> to GIO7<0:7>. That is, the data serially inputted through one data pin, e.g., DQ0 pin, are converted to aligned data and the aligned data are transferred onto 8 global lines, e.g., GIO0<0:7>. These global lines GIO0<0:7> to GIO7<0:7> are connected to Y blocks 11, 21, 31 and 41 of all of the banks 10, 20, 30 and 40.

In FIG. 2, there is illustrated only one quarter of the memory device having the quarter bank structure and thus all of the Y blocks 11, 21, 31 and 41 corresponding to the banks 10, 20, 30 and 40 are connected to the global lines GIO0<0:7> to GIO7<0:7> corresponding to the 8 data pins. Each of banks disposed in the rest of the quarters that are not shown in figures may be connected to its own global lines corresponding to its own 8 data pins. For instance, the banks 50, 60, 70 and 80 in FIG. 1 may be connected to global lines corresponding to data pins DQ8 to DQ15 that are not shown in figures.

An inversion information (WDBI) input circuit 290 receives inversion information WDBI through an inversion pin WDBI0 inputted from the memory controller and transfers the inversion information WDBI to the Y blocks 11, 21, 31 and 41 of the banks 10, 20, 30 and 40. Like the data, the inversion information WDBI is serially inputted through the inversion pin WDBI0, and the WDBI input circuit 290 aligns the serially inputted inversion information WDBI in parallel and transfers the aligned inversion information to the Y blocks 11, 21, 31 and 41 of the banks 10, 20, 30 and 40 through inversion lines WDBI<0:7>. One inversion pin per 8 data pins are disposed. In FIG. 2, there is illustrated the WDBI input circuit 290 that processes the inversion information WDBI of data inputted through the data pins DQ0 to DQ7.

In the Y blocks 11, 21, 31 and 41 of the banks 10, 20, 30 and 40, there are write drivers for transferring data on the global lines GIO0<0:7> to GIO7<0:7> to local lines LIO/LIOB in the banks 10, 20, 30 and 40. The write drivers invert or non-invert the data on the global lines GIO according to the inversion information WDBI and transfer the inverted or non-inverted data to the local lines LIO/LIOB. Each of the banks 10, 20, 30 and 40 includes the local lines LIO/LIOB whose number is the same as that of the global lines GIO. Moreover, each of the banks 10, 20, 30 and 40 includes write drivers corresponding to the number of the global lines GIO. For instance, the Y block 11 includes 64 write drivers.

FIG. 3 illustrates a block diagram of the data input circuit 210 illustrated in FIG. 2.

Referring to FIG. 3, the data input circuit 210 includes a data buffering unit 310, a data aligning unit 320 and a driving unit 330.

The data buffering unit 310 buffers data DATA_IN inputted through a data pad, which is a pad on a wafer connected to a data pin, and transfers the buffered data to the data aligning unit 320. Data are sequentially inputted to the data pad according to a prefetch scheme. In case of employing the 8-bit prefetch scheme, 8 data are continuously inputted in series in response to one write command.

The data aligning unit 320 aligns the serially inputted data in parallel. The number of data to be aligned in parallel is changed according to the number of bits processed by the prefetch scheme. For instance, in case of the 8-bit prefetch scheme, 8 data inputted in series are outputted in parallel through 8 lines GIO_PRE0<0:7>. Since the data inputted to the data aligning unit 320 are aligned and inputted on rising/falling edges of a data input clock WT_CLK, the data aligning unit 320 aligns the inputted data in parallel using the data input clock WT_CLK. FIG. 4 shows a data aligning process performed in the data aligning unit 320. Referring to FIG. 4, it is possible to more clearly understand the data aligning process.

The driving unit 330 loads the aligned data on GIO_PRE<0:7> onto the global lines GIO0<0:7>. The driving unit 330 is strobed by TDQSS_CLK and loads the data onto the global lines GIO0<0:7>. The TDQSS_CLK is a clock having a period corresponding to an interval between two write commands that are sequentially inputted.

FIG. 5 illustrates a block diagram of the inversion information (WDBI) input circuit 290 illustrated in FIG. 2.

Referring to FIG. 5, the WDBI input circuit 290 includes an inversion buffering unit 510, an inversion aligning unit 520 and a driving unit 530.

The inversion buffering unit 510 buffers inversion information WDBI_IN inputted through an inversion (WDBI) pad and transfers the buffered inversion information WDBI to the inversion aligning unit 520, wherein the WDBI pad is a pad on a die corresponding to an inversion pin. The inversion information WDBI_IN is continuously inputted in a series like data.

The inversion aligning unit 520 aligns in parallel the inversion information WDBI_IN inputted in series. The inversion aligning unit 520 aligns the buffered inversion information WDBI instead of the data and may have the same configuration as that of the data aligning unit 320. FIG. 6 illustrates an inversion information (WDBI) aligning process performed in the inversion aligning unit 520. Referring to FIG. 6, it is possible to more clearly understand the WDBI aligning process.

The driving unit 530 loads the aligned inversion information WDBI_PRE<0:7> outputted from the inversion aligning unit 520 onto inversion lines WDBI<0:7>. The driving unit 530 is strobed by TDQSS_CLK and loads the aligned inversion information WDBI_PRE<0:7> onto the inversion lines WDBI<0:7>.

FIG. 7 illustrates a circuit diagram of one of write drivers disposed in the Y block 11 of the bank 10.

There is an exclusive OR (XOR) gate 701 disposed at a front end of a write driver (WT_DRV) 702. The write driver 702 transfers an output of the XOR gate 701 onto local lines LIO_0<0> and LIOB_0<0>. The XOR gate 701 logically combines data on a global line GIO0<0> and inversion information WDBI<0>. Therefore, if the inversion information WDBI<0> has a logic low level, the data on the global line GIO0<0> is directly transferred onto the local lines LIO_0<0> and the LIOB_0<0>. On the other hand, if the inversion information WDBI<0> has a logic high level, the data on the global line GIO0<0> is inverted and then the inverted data is transferred onto the local lines LIO_0<0> and the LIOB_0<0>.

As described above, in the conventional memory device, the write driver 702 reflects the inversion information on the data.

A write enable signal WTEN illustrated in FIG. 7 is a signal that is enabled in a write operation. Therefore, the write enable signal WTEN controls the write driver 702 to be inactivated in a read operation since, as is well known, the data on the local lines LIO/LIOB should be transferred onto the global line GIO through a sense amplifier in the read operation.

As shown above, in the conventional memory device, the write driver plays a part of reflecting the inversion information on the data. The number of write drivers disposed in the Y block is the same as that of the local lines included in each bank. Thus, in case that the memory device uses a 4-bank, x32, an 8-bit prefetch scheme, the number of write drivers becomes 1024. In this case, the number of exclusive logic gates used to perform the data inversion operation also becomes 1024. This increases a total area of the memory device and thus the current consumption required to perform the data inversion operation is also increased.

As a memory device goes to high-capacity, the number of banks thereof is getting increased and thus the number of write drivers is also increased in proportion to the number of banks. For instance, if the number of banks is 16, the required number of write drivers becomes 4096, which is 4 times the number of write drivers in case of including 4 banks, and thus the number of exclusive OR gates also becomes 4096. Therefore, as the memory device goes to high-capacity, there is a problem that the area of circuits required to perform the data inversion operation gradually increases.

SUMMARY OF THE INVENTION

Embodiments of the present subject matter are directed to providing a data input circuit capable of reducing an area of circuits required in performing a data inversion operation and a semiconductor memory device including the data input circuit.

In accordance with an aspect of the disclosure, there is provided a semiconductor memory device including: a plurality of data input circuits configured to reflect inversion information on data inputted thereto; a plurality of global lines for transferring data outputted from the plurality of data input circuits; and a plurality of memory banks for storing data transferred from the plurality of global lines.

Each of the data input circuits may include a data buffering unit configured to buffer data inputted through a data pin; a data aligning unit configured to align the buffered data outputted from the data buffering unit in parallel; an inversion unit configured to invert or non-invert the aligned data outputted from the data aligning unit according to the inversion information; and a driving unit configured to transfer data outputted from the inversion unit onto the global lines.

In accordance with another aspect of the disclosure, there is provided a data input circuit including: a data buffering unit configured to buffer data inputted through a data pin; a data aligning unit configured to align the buffered data outputted from the data buffering unit in parallel; an inversion unit configured to invert or non-invert the aligned data outputted from the data aligning unit according to inversion information; and a driving unit configured to transfer data outputted from the inversion unit onto a plurality of global lines.

In accordance with still another aspect of the disclosure, there is provided a semiconductor memory device including: a data pad; an inversion pad; a data aligning unit configured to align data inputted through the data pad in parallel; an inversion aligning unit configured to align inversion information inputted through the inversion pad in parallel; an inversion unit configured to invert or non-invert the aligned data outputted from the data aligning unit according to the aligned inversion information outputted from the inversion aligning unit; a global bus for transferring data outputted from the inversion unit; and a write driving unit configured to transmit data transferred from the global bus to local bus so as to store the transmitted data in a bank.

BRIEF DESCRIPTION OF THE DRAWINGS

FIG. 1 illustrates a configuration of a semiconductor memory device having a conventional 4 quarter bank structure.

DESCRIPTION OF SPECIFIC EMBODIMENTS

Other objects and advantages of the present subject matter can be understood by the following description, and become apparent with reference to the embodiments of the present subject matter.

Figure 8:
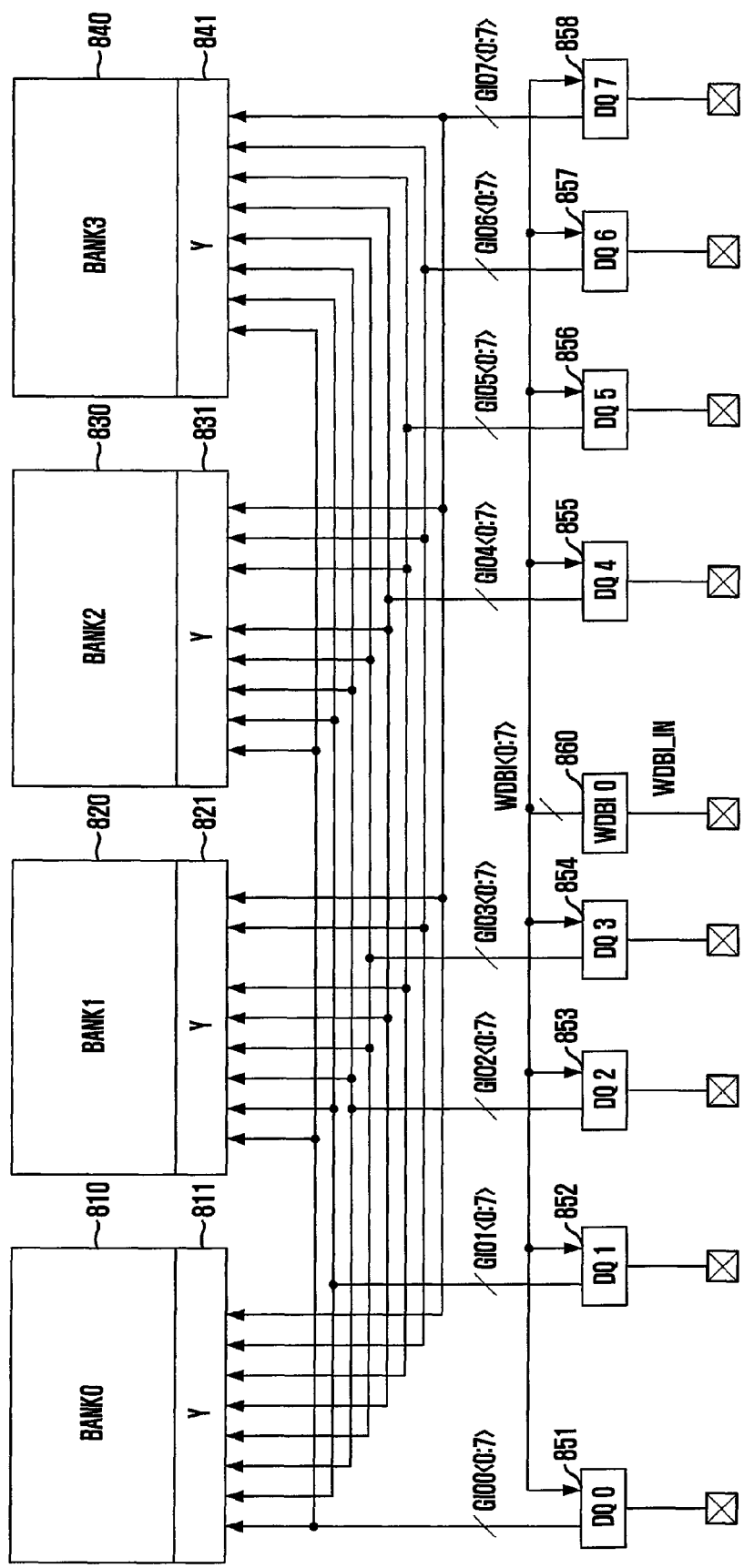
FIG. 8 illustrates a configuration of a semiconductor memory device in accordance with an embodiment of the present subject matter.

FIG. 8 is a view illustrating a configuration of a semiconductor memory device in accordance with an embodiment of the present subject matter.

Referring to FIG. 8, the semiconductor memory device includes a plurality of data input circuits 851 to 858 configured to reflect inversion information WDBI<0:7> on data inputted thereto, a plurality of global lines GIO0<0:7> to GIO7<0:7> for transferring data outputted from the data input circuits 851 to 858, and a plurality of memory banks 810 to 840 for storing data transferred from the global lines GIO0<0:7> to GIO7<0:7> therein.

The data input circuits 851 to 858 receive data from respective data pins (pads) corresponding thereto and transfer the data onto the global lines GIO0<0:7> to GIO7<0:7>. Likewise, in the prior art, the input circuits 851 to 858 align the serially inputted data in parallel according to a prefetch scheme and transfer the aligned data onto the global lines GIO0<0:7> to GIO7<0:7>. Moreover, the data input circuits 851 to 858 play a role of reflecting the inversion information WDBI<0:7> on the data. According to the prior art, write drivers included in the Y blocks 811, 821, 831 and 841 of the banks 810 to 840 reflect the inversion information WDBI<0:7> on the data. However, in accordance with the present subject matter, the data input circuits 851 to 858 perform inversion or non-inversion of the data according to the inversion information WDBI<0:7>. Therefore, the memory device includes circuits for performing the data inversion, wherein the number of the data inversion circuits is the same as that of the global lines GIO0<0:7> to GIO7<0:7>.

In case of using an 8-bit prefetch scheme, the data input circuits 851 to 858 align the serially inputted data in parallel by eights and transfer the aligned data onto the global lines GIO0<0:7> to GIO7<0:7>. Therefore, each of the data input circuits 851 to 858 includes 8 data inversion circuits. In case that the memory device includes 32 data pins, there are 32 data input circuits. In this case, 256 data inversion circuits are required. Compared to the prior art requiring 256×(Nos. of banks) data inversion circuits, the present subject matter requires a substantially reduced number of data inversion circuits.

For reference, since FIG. 8 illustrates only one quarter of the memory device having a quarter bank structure, there are shown 8 data pads, 8 data input circuits 851 to 858, and one inversion input circuit 860 in the drawing. In general, the memory device includes totally 32 data pads, 32 data input circuits, and 4 inversion input circuits therein although all of them are not shown.

Figure 2:
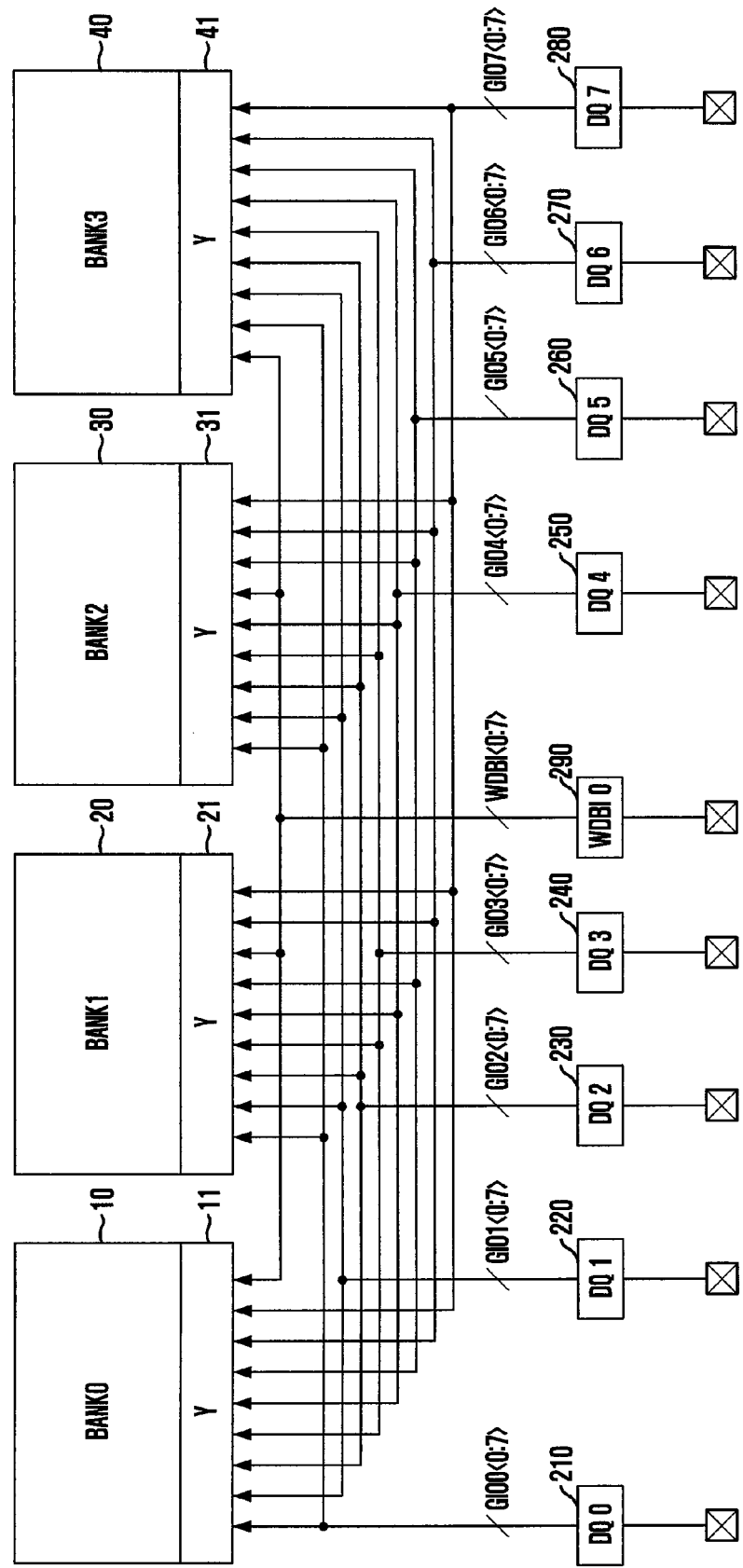
FIG. 2 illustrates paths through which data is transmitted from data input circuits to banks.
Figure 3:
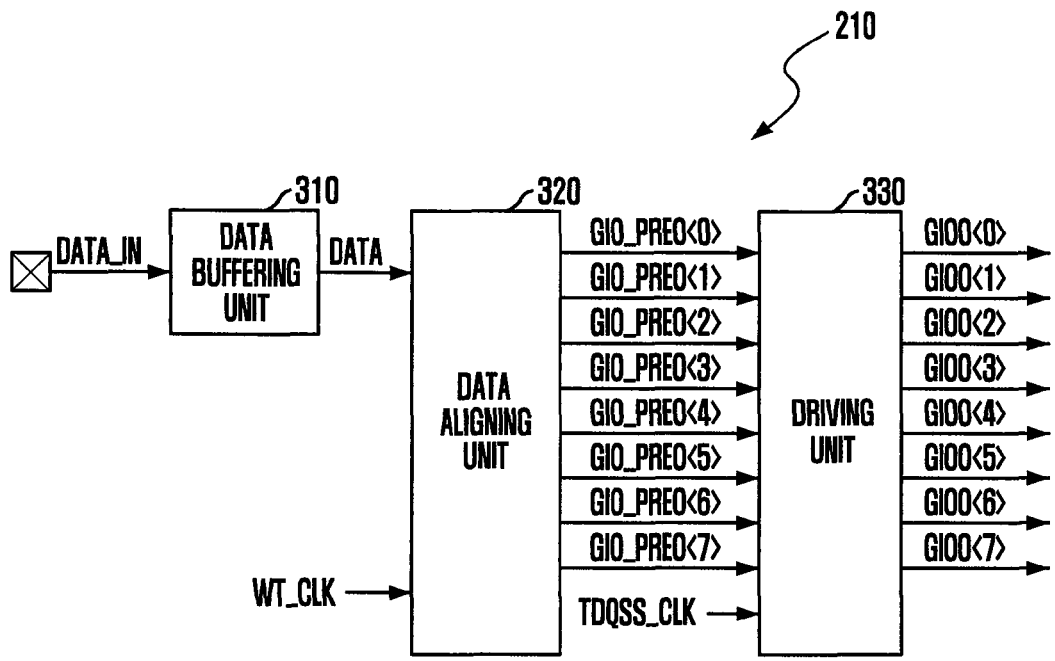
FIG. 3 illustrates a block diagram of a data input circuit illustrated in FIG. 2.
Figure 4:
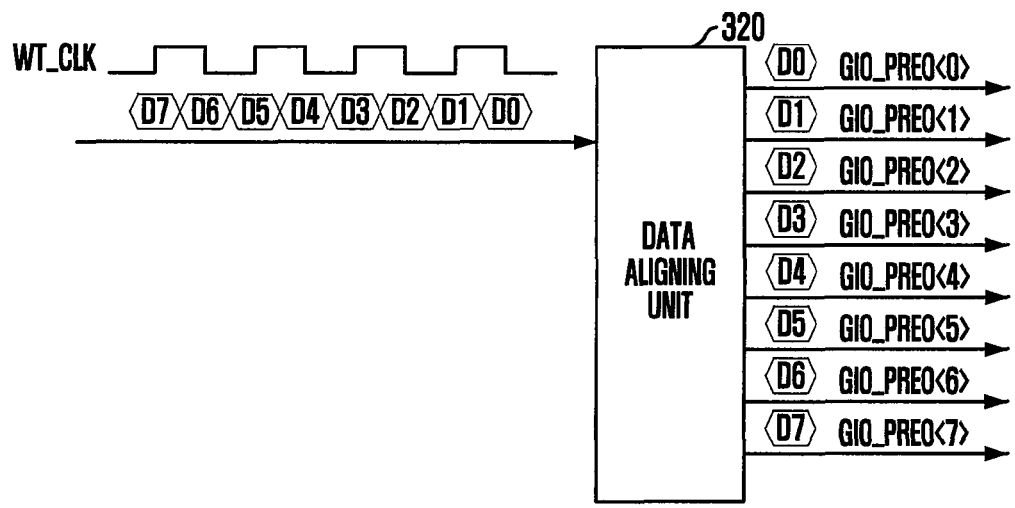
FIG. 4 shows a data aligning process performed in a data aligning unit illustrated in FIG. 3.

The inversion input circuit 860 receives inversion information WDBI_IN inputted thereto through an inversion pin (pad) WDBI0. The inversion information WDBI_IN is also sequentially inputted in series like data. The inversion input circuit 860 aligns the inputted inversion information in parallel according to the prefetch scheme. The conventional inversion input circuit 290 illustrated in FIG. 2 transfers the inversion information WDBI<0:7> to each bank since the write drivers included in each bank reflect the inversion information WDBI<0:7> on the data. However, in accordance with the present subject matter, the data input circuits 851 to 858 reflect the inversion information WDBI<0:7> on the data. Therefore, the inversion input circuit 860 transfers the inversion information WDBI<0:7> to the data input circuits 851 to 858. In general, one inversion pin is disposed for every eight data pins. Thus, one inversion input circuit 860 is included for every eight data input circuits 851 to 858. However, the number of the inversion pins and that of the inversion input circuits may be changed if the specifications of the memory device are changed.

In accordance with the present subject matter, since the data input circuits 851 to 858 reflect the inversion information WDBI<0:7> on the data, there is no need to include exclusive OR gates for the data inversion in write drivers included in the Y blocks 811 to 841 of the banks 810 to 840.

Figure 9:
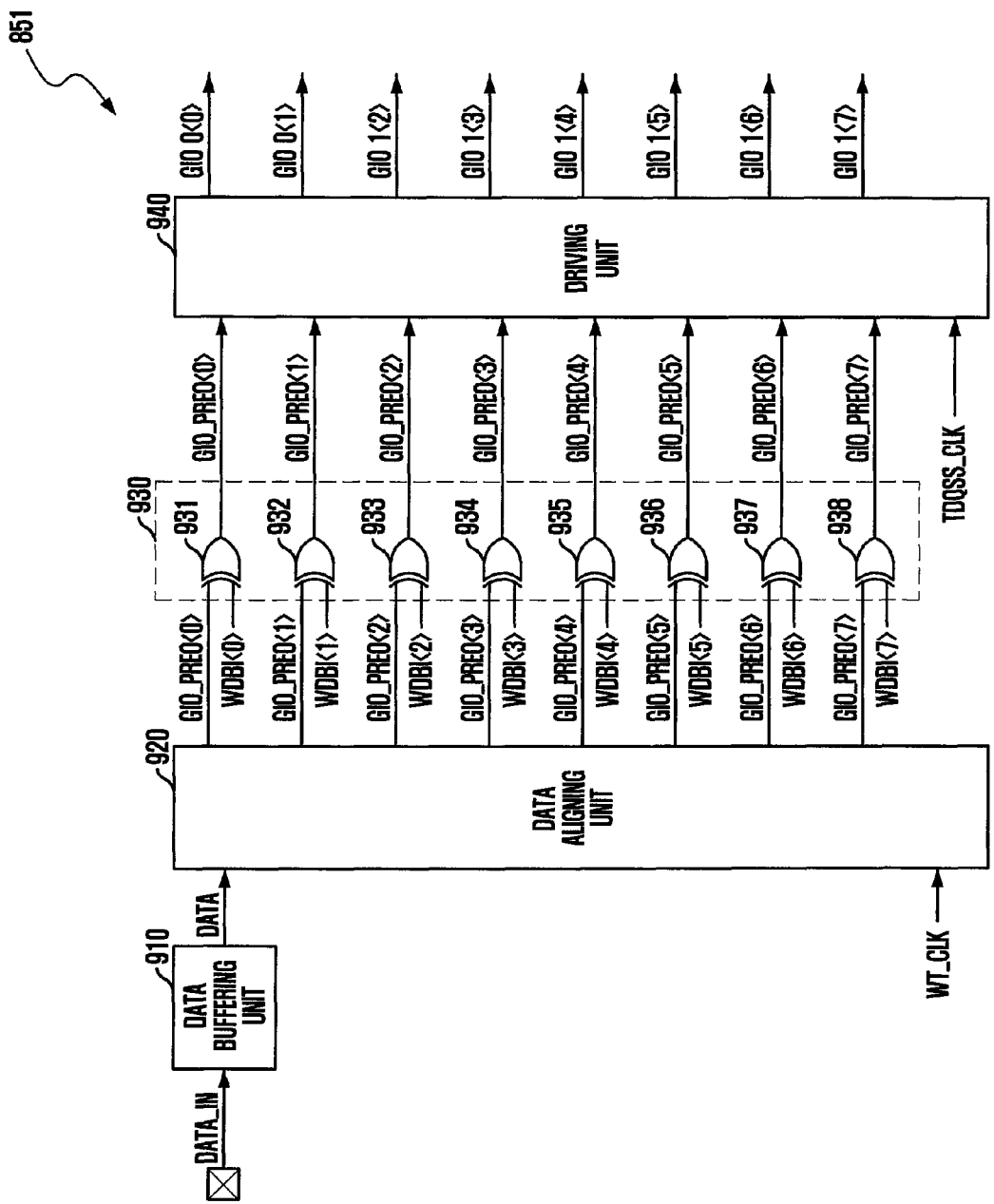
FIG. 9 illustrates a block diagram of a data input circuit illustrated in FIG. 8.

FIG. 9 illustrates a block diagram of the data input circuit 851 illustrated in FIG. 8.

Since the data input circuits 852 to 858 also have the same configuration as that of the data input circuit 851, the data input circuit will be described in detail with reference to the data input circuit 851 illustrated in FIG. 9, hereinafter.

The data input circuit 851 includes a data buffering unit 910 configured to buffer data DATA_IN inputted through a data pin, a data aligning unit 920 configured to align the buffered data DATA outputted from the data buffering unit 910 in parallel, an inversion unit 930 configured to invert or non-invert the aligned data GIO_PRE0<0:7> outputted from the data aligning unit 920 according to the inversion information WDBI<0:7>, and a driving unit 940 configured to transfer the data GIO_DBI_PRE0<0:7> outputted from the inversion unit 930 onto the plurality of global lines GIO0<0:7>.

The inversion unit 930 may include a plurality of exclusive OR gates 931 to 938 as illustrated in FIG. 9. The exclusive OR gates 931 to 938 invert the data GIO_PRE0<0:7> if the inversion information WDBI<0:7> has a logic high level. On the other hand, if the inversion information WDBI<0:7> has a logic low level, the exclusive OR gates 931 to 938 directly output the data GIO_PRE0<0:7> without inversion. Therefore, the data outputted from the data input circuit 851 are loaded on the global lines GIO0<0:7> after being reflected with the inversion information WDBI<0:7>.

Since the data buffering unit 910, the data aligning unit 920 and the driving unit 940 may have the same configurations as those of the conventional circuits, they are not described in detail herein.

Figure 10:
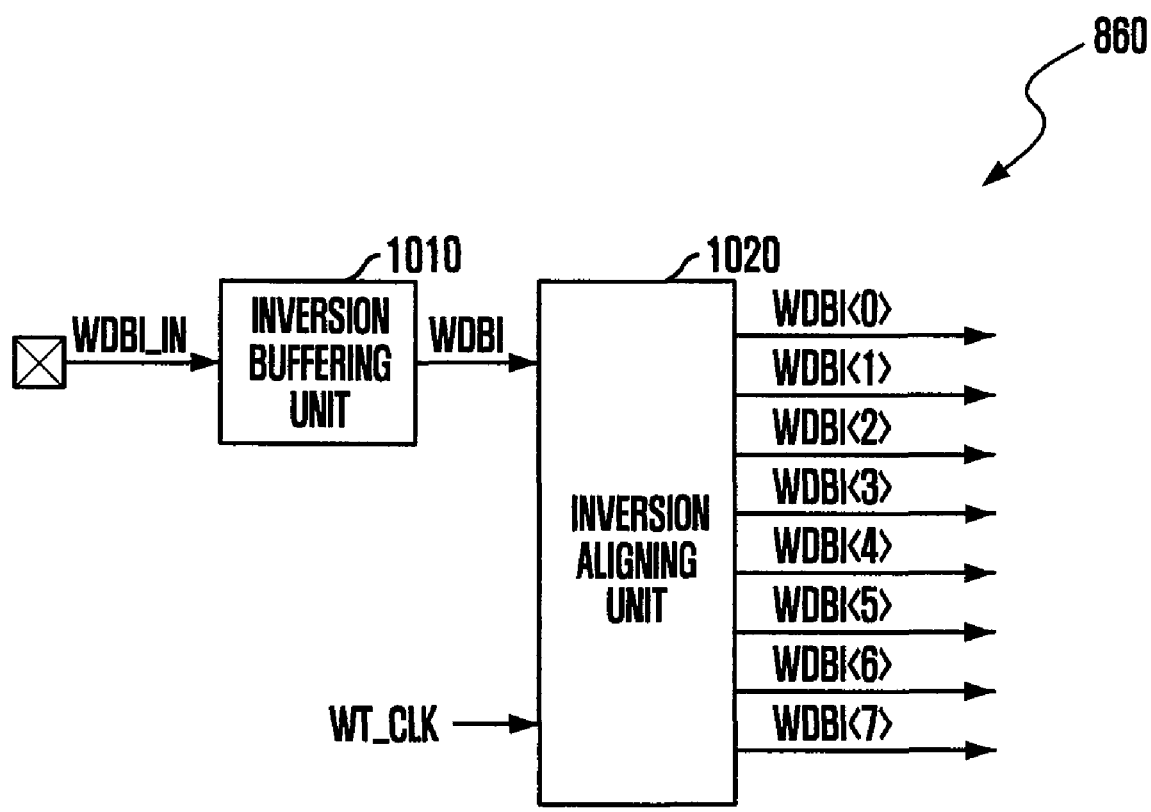
FIG. 10 illustrates a block diagram of an inversion information input circuit illustrated in FIG. 8.

FIG. 10 illustrates a block diagram of the inversion information input circuit 860 illustrated in FIG. 8.

Referring to FIG. 10, the inversion information input circuit 860 includes an inversion buffering unit 1010 configured to buffer inversion information WDBI_IN inputted through the inversion pin, and an inversion aligning unit 1020 configured to align the buffered inversion information WDBI in parallel and transfers the aligned inversion information WDBI<0:7> to the data input circuits 851 to 858.

Figure 5:
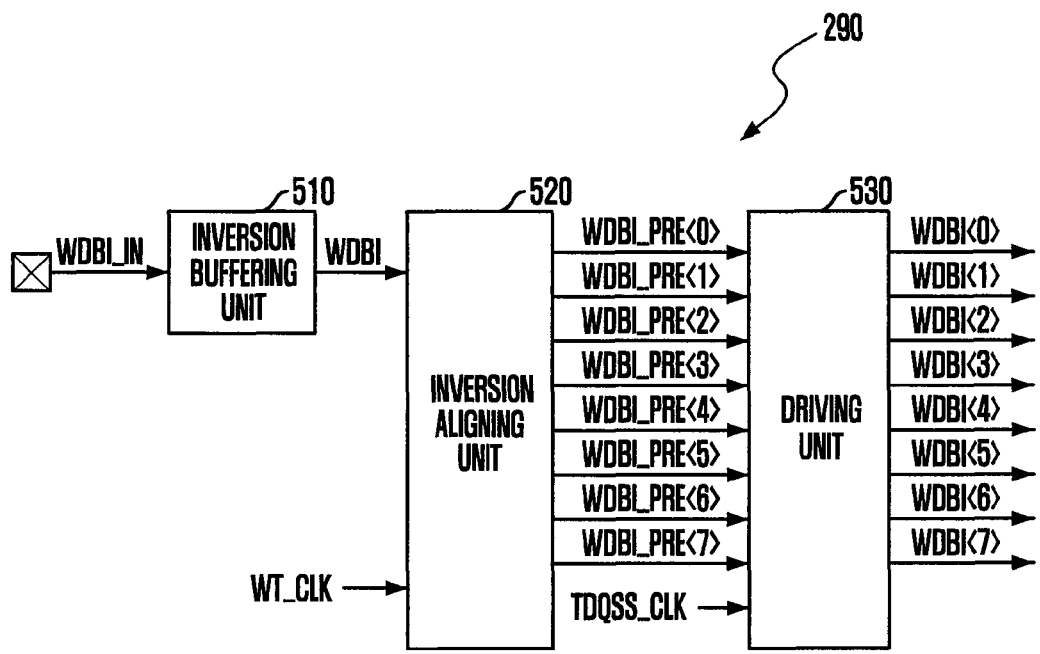
FIG. 5 illustrates a block diagram of an inversion information input circuit illustrated in FIG. 2.
Figure 6:
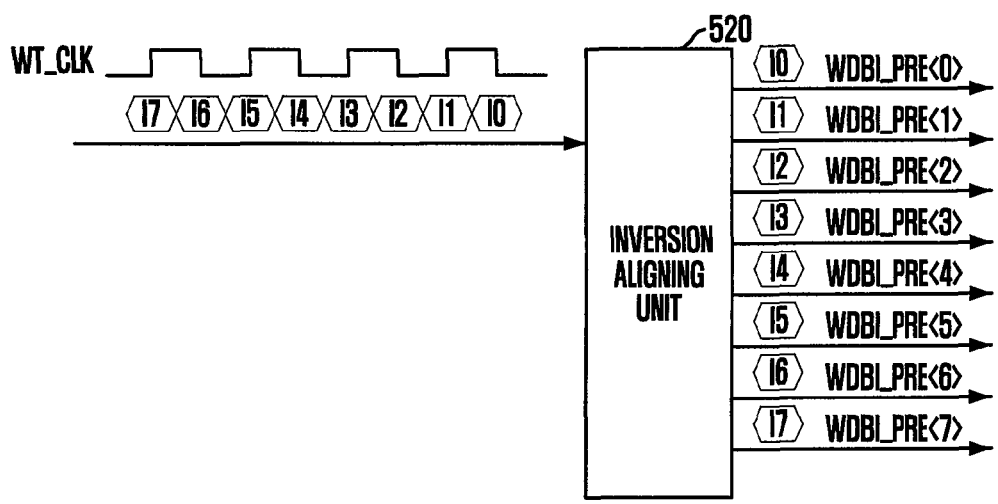
FIG. 6 illustrates an inversion information aligning process performed in an inversion aligning unit illustrated in FIG. 5.
Figure 7:
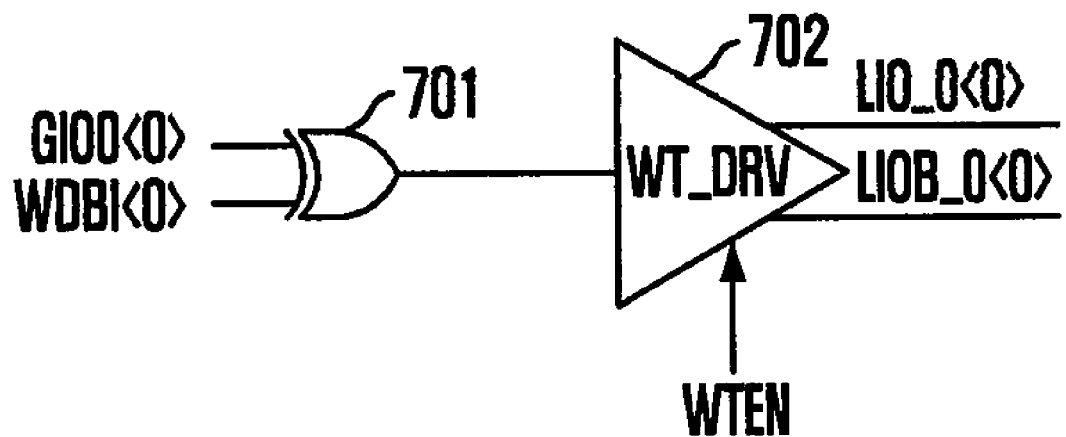
FIG. 7 illustrates a circuit diagram of one of write drivers disposed in a Y block of a bank.

The inversion buffering unit 1010 and the inversion aligning unit 1020 may have the same configurations as those of the units illustrated in FIG. 5. In accordance with the present subject matter, the existing driving unit 530 illustrated in FIG. 5 is omitted since, if the inversion information WDBI<0:7> is transferred to the data input circuits 851 to 858, the driving units, e.g., 940, in the data input circuits 851 to 858 reflect the inversion information WDBI<0:7> on the data and then drive the data onto the global lines GIO0<0:7> to GIO7<0:7>.

Figure 11:
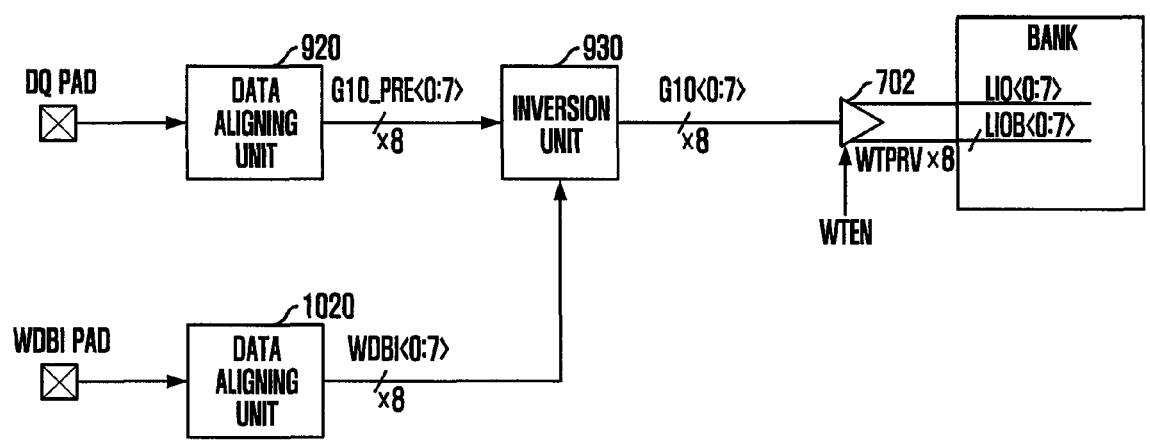
FIG. 11 illustrates an operation of the semiconductor memory device in accordance with the present subject matter.

FIG. 11 is a view provided to explain an operation of the semiconductor memory device in accordance with the present subject matter.

In FIG. 11, there is shown a path through which the data and the inversion information inputted through one data (DQ) pad and one inversion (WDBI) pad, respectively, are transferred to the memory banks. Herein, FIG. 11 does not show the buffer, the driver and so on, which are required in transmitting signals, e.g., data.

As illustrated in FIG. 11, the semiconductor memory device in accordance with the present subject matter includes the DQ pad, the WDBI pad, the data aligning unit 920 configured to align the data inputted through the DQ pad in parallel, the inversion aligning unit 1020 configured to align the inversion information inputted through the WDBI pad in parallel, the inversion unit 930 for invert or non-invert the data GIO_PRE<0:7> outputted from the data aligning unit 920 according to the inversion information WDBI<0:7> outputted from the inversion aligning unit 1020, the global bus GIO<0:7> for transferring the data outputted from the inversion unit 930, and the write driver 702 for transferring the data from the global bus GIO<0:7> to the local bus LIO/LIOB<0:7> so as to store the data in the bank.

Since the semiconductor memory device in accordance with the present subject matter includes the above-described configuration, the data can be reflected with the inversion information WDBI<0:7> before being loaded on the global bus GIO<0:7> and thus it is possible to reduce a whole area of the memory device.

In the semiconductor memory device in accordance with the present subject matter, the data input circuit performs the data inversion operation. Therefore, the data on which the inversion information is already reflected is transferred to each bank through the global lines.

In the present subject matter, the data inversion circuits whose number is the same as that of the global lines are included. In the prior art, the number of the data inversion circuits is the same as that of the local lines and the number of the local lines is obtained by multiplying the number of global lines by the number of banks. Therefore, the semiconductor memory device in accordance with the present subject matter has an effect of reducing the number of the data inversion circuits by ¼, ⅛, 1/16 and so on.

By reducing the number of the data inversion circuits, it is possible to reduce the whole area of the semiconductor memory device and the current consumption thereof.

While the present subject matter has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a plurality of data input circuits configured to reflect inversion information on data inputted thereto;
   a plurality of global lines for transferring data outputted from the plurality of data input circuits; and
   a plurality of memory banks for storing data transferred from the plurality of global lines,
   wherein each of the data input circuits comprises:
      a data buffering unit configured to buffer data inputted through a data pin;
      a data aligning unit configured to align the buffered data outputted from the data buffering unit in parallel;
      an inversion unit configured to invert or non-invert the aligned data outputted from the data aligning unit according to the inversion information; and
      a driving unit configured to transfer data outputted from the inversion unit onto the global lines.

2. The semiconductor memory device of claim 1, wherein the data aligning unit aligns the buffered data in parallel using a data input clock, wherein the buffered data are serially inputted to the data aligning unit.

3. The semiconductor memory device of claim 1, wherein the inversion unit comprises a plurality of logic gates to invert or non-invert the aligned data outputted from the data aligning unit according to the inversion information.

4. The semiconductor memory device of claim 1, further comprising:
   an inversion information input circuit configured to receive the inversion information from an inversion pin and transfer the inversion information to the plurality of data input circuits.

5. The semiconductor memory device of claim 1, further comprising:
   an inversion buffering unit configured to buffer the inversion information inputted through an inversion pin; and
   an inversion aligning unit configured to align the buffered inversion information outputted from the inversion buffering unit in parallel and transfer the aligned inversion information to the inversion unit.

6. A data input circuit, comprising:
   a data buffering unit configured to buffer data inputted through a data pin;
   a data aligning unit configured to align the buffered data outputted from the data buffering unit in parallel;
   an inversion unit configured to invert or non-invert the aligned data outputted from the data aligning unit according to inversion information; and
   a driving unit configured to transfer data outputted from the inversion unit onto a plurality of global lines.

7. The data input circuit of claim 6, wherein the data aligning unit aligns the buffered data in parallel using a data input clock, wherein the buffered data is serially inputted to the data aligning unit.

8. The data input circuit of claim 6, wherein the inversion unit comprises a plurality of logic gates to invert or non-invert the aligned data outputted from the data aligning unit according to the inversion information.

9. A semiconductor memory device, comprising:
   a data pad;
   an inversion pad;
   a data aligning unit configured to align data inputted through the data pad in parallel;
   an inversion aligning unit configured to align inversion information inputted through the inversion pad in parallel;
   an inversion unit configured to invert or non-invert the aligned data outputted from the data aligning unit according to the aligned inversion information outputted from the inversion aligning unit;
   a global bus for transferring data outputted from the inversion unit; and
   a write driving unit configured to transmit data transferred from the global bus to local bus so as to store the transmitted data in a bank.

10. The semiconductor memory device of claim 9, wherein the inversion unit comprises a plurality of logic gates to invert or non-invert the aligned data outputted from the data aligning unit according to the aligned inversion information outputted from the inversion aligning unit.

* * * * *